(12) United States Patent
Vanderveen et al.

(10) Patent No.: US 9,591,781 B2
(45) Date of Patent: Mar. 7, 2017

(54) FLOATING DAUGHTER CARD SYSTEM

(71) Applicant: Brocade Communications Systems, Inc., San Jose, CA (US)

(72) Inventors: Anthony Vanderveen, San Jose, CA (US); David Skirmont, Los Gatos, CA (US); Peter Doyle, Los Altos, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 280 days.

(21) Appl. No.: 14/448,796

(22) Filed: Jul. 31, 2014

(65) Prior Publication Data
US 2015/0173193 A1 Jun. 18, 2015

Related U.S. Application Data

(60) Provisional application No. 61/915,986, filed on Dec. 13, 2013.

(51) Int. Cl.
| | |
|---|---|
| *H05K 7/00* | (2006.01) |
| *H05K 7/12* | (2006.01) |
| *H05K 7/14* | (2006.01) |
| *H05K 1/14* | (2006.01) |

(52) U.S. Cl.
CPC .......... *H05K 7/1407* (2013.01); *H05K 1/141* (2013.01); *H05K 7/1454* (2013.01); *H05K 1/144* (2013.01); *H05K 2201/042* (2013.01); *H05K 2201/10189* (2013.01); *H05K 2201/10446* (2013.01); *H05K 2201/2036* (2013.01)

(58) Field of Classification Search
CPC ....... H05K 1/141–1/144; H05K 7/1451; F16B 5/0208
USPC ........ 361/770, 790, 803, 752–759, 807–810; 174/138 G–138 F
See application file for complete search history.

(56) References Cited

U.S. PATENT DOCUMENTS

| | | | | |
|---|---|---|---|---|
| 5,903,439 | A * | 5/1999 | Tamarkin | H05K 7/1451 174/138 G |
| 6,549,410 | B1 * | 4/2003 | Cohen | H01L 23/4006 165/185 |
| 6,644,903 | B1 * | 11/2003 | Arand | F16B 5/0208 411/107 |
| 6,981,068 | B1 | 12/2005 | Harari et al. | |
| 6,995,982 | B2 * | 2/2006 | Gonzalez | H05K 7/142 361/742 |
| 7,980,859 | B2 | 7/2011 | Mizumura et al. | |
| 8,292,644 | B2 | 10/2012 | Hamner et al. | |
| 2004/0218367 | A1 * | 11/2004 | Lin | H05K 1/144 361/721 |
| 2008/0056844 | A1 * | 3/2008 | Aukzemas | F16B 5/0208 411/353 |

(Continued)

*Primary Examiner* — Tuan T Dinh
(74) *Attorney, Agent, or Firm* — Innovation Counsel LLP; Serge J. Hodgson (57) ABSTRACT

A blade includes both a motherboard and daughter card to allow the combined functionality to be incorporated into a single blade for size reduction. Standoffs couple the daughter card to the motherboard. Cantilever portions of the motherboard and daughter card exist between the standoffs and terminals of the motherboard and daughter card. The cantilever portions bend to accommodate any misalignment between the terminals of the motherboard and the daughter card and mating connectors of a bulkhead or printed circuit board backplane.

19 Claims, 5 Drawing Sheets

(56) References Cited

U.S. PATENT DOCUMENTS

2009/0321530 A1 12/2009 Harari et al.

* cited by examiner

ND CARD SYSTEM

FLOATING DAUGHTER CARD SYSTEM

RELATED APPLICATIONS

This application claims the benefit of U.S. Provisional Application No. 61/915,986 filed on Dec. 13, 2013, entitled "FLOATING DAUGHTER CARD SYSTEM AND METHOD" of Vanderveen et al., which is incorporated herein by reference in its entirety.

BACKGROUND

Field

The present application relates to the field of electronics, and more particularly, to structures for electronic devices and related methods.

Description of the Related Art

In a traditional switch, a printed circuit board (PCB) backplane has connectors that interface with blades of the switch. The PCB backplane includes a dielectric core and electrically conductive traces supported by the dielectric core. Signals between blades and generally between components of the switch are propagated along the conductive traces.

However, as more functionality and components are combined to form larger switches, the number and density of connections to the PCB backplane to interconnect the various components correspondingly increases. Tolerance in the alignment of the connectors can lead to challenges in assembly and maintenance of the switch.

SUMMARY

In accordance with one embodiment, a blade includes both a motherboard and daughter card to allow the combined functionality to be incorporated into a single blade for size reduction. Standoffs couple the daughter card to the motherboard. Cantilever portions of the motherboard and daughter card exist between the standoffs and terminals of the motherboard and daughter card. The cantilever portions bend to accommodate any misalignment between the terminals of the motherboard and the daughter card and mating connectors of a bulkhead or printed circuit board backplane.

In accordance with another embodiment, springs allow the daughter card to float relative to the motherboard. The float accommodates any misalignment between the terminals of the motherboard and the daughter card and mating connectors of a bulkhead or printed circuit board backplane.

In accordance with yet another embodiment, the terminals of the daughter card and motherboard are fixed in position. Fixed and floating connectors are coupled to a bulkhead. The fixed connector is fixed in position relative to the bulkhead and the floating connector is moveable relative to the bulkhead. The floating connector is configured to accommodate tolerance in the positioning of the terminals of the motherboard and the daughter card with respect to the fixed connector and the floating connector.

These and other features in accordance with various embodiments will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
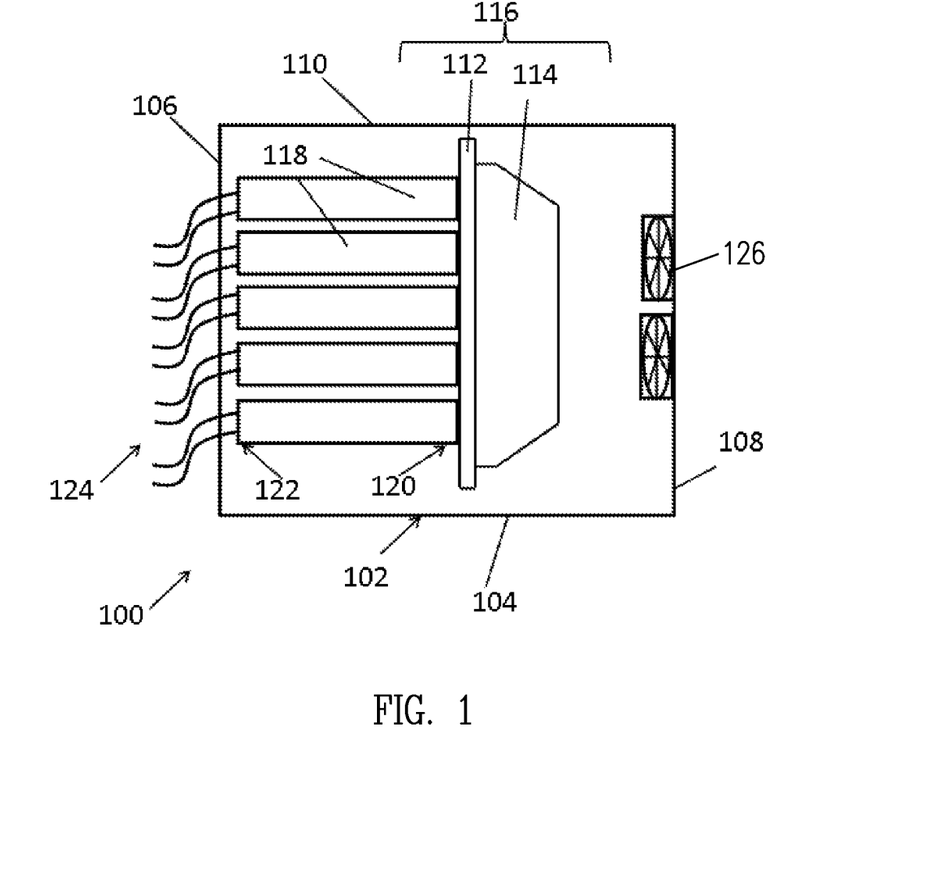
FIG. 1 is a side schematic diagram of an electronic device in accordance with one embodiment.

FIG. 1 is a side schematic diagram of an electronic device 100, e.g., a switch, in accordance with one embodiment. Electronic device 100 includes a chassis 102 that forms that framework that supports the various components of electronic device 100.

Generally, electronic device 100 includes a horizontal base 104, e.g., that extends in a first direction. Electronic device 100 further includes a vertical front face 106, e.g., that extends in a second direction perpendicular to the first direction of horizontal base 104. Electronic device 100 further includes a vertical rear face 108 that also extends in the second direction perpendicular to the first direction of horizontal base 104. For discussion purposes herein, front face 106 is in a vertical front plane of electronic device 100 and rear face 108 is an approximately parallel vertical rear plane of electronic device 100.

Electronic device 100 further includes a horizontal top 110 parallel to base 104 and perpendicular to faces 106, 108. Faces 106, 108 extend between base 104 and top 110. Although the terms vertical, horizontal and similar terms are used herein, the terms are used for simplicity to generally mean in a first direction and a perpendicular second direction and it is to be understood that the terms are not gravitationally referenced.

Located within chassis 102 is a bulkhead 112. In one embodiment, bulkhead 112 is a flat plate, e.g., a machined aluminum plate, extending in the vertical direction. Bulkhead 112 includes cutouts and other openings to accommodate various components of electronic device 100.

One or more cable cassettes 114 are coupled to bulkhead 112. Cable cassettes 114 include internal cabling and connectors that mount to the cutouts in bulkhead 112. This cabling allows high speed signal propagation thus allowing the size of electronic device 100 to be relatively large, i.e., to accommodate a large amount of components.

Further, bulkhead 112 and cable cassettes 114 form a bulkhead assembly 116 that replaces a traditional PCB backplane from the standpoint of the customer, e.g., the user of electronic device 100. More particularly, one or more blades 118, e.g., line cards, switch fabrics, and/or management modules, can be readily connected to and disconnected from bulkhead assembly 116.

Blades 118 include bulkhead assembly connector ends 120 and opposite wiring ends 122. Bulkhead assembly connector ends 120 mechanically and electrically interconnect with bulkhead assembly 116.

Wiring ends 122 include various ports or other data structures as well as mechanical structures, e.g., ejector handles, to allow securement and removal of blades 118 from chassis 102. For example, external cabling 124 is connected to blades 118 at wiring ends 122.

Located at or adjacent rear face 108 of electronic device 100 is one or more fans 126, sometimes called fan Field Replaceable Units (FRUs). Fans 126 circulate air through electronic device 100 to insure electronic device 100 including the components therein are maintained at proper operating temperatures.

Figure 2:
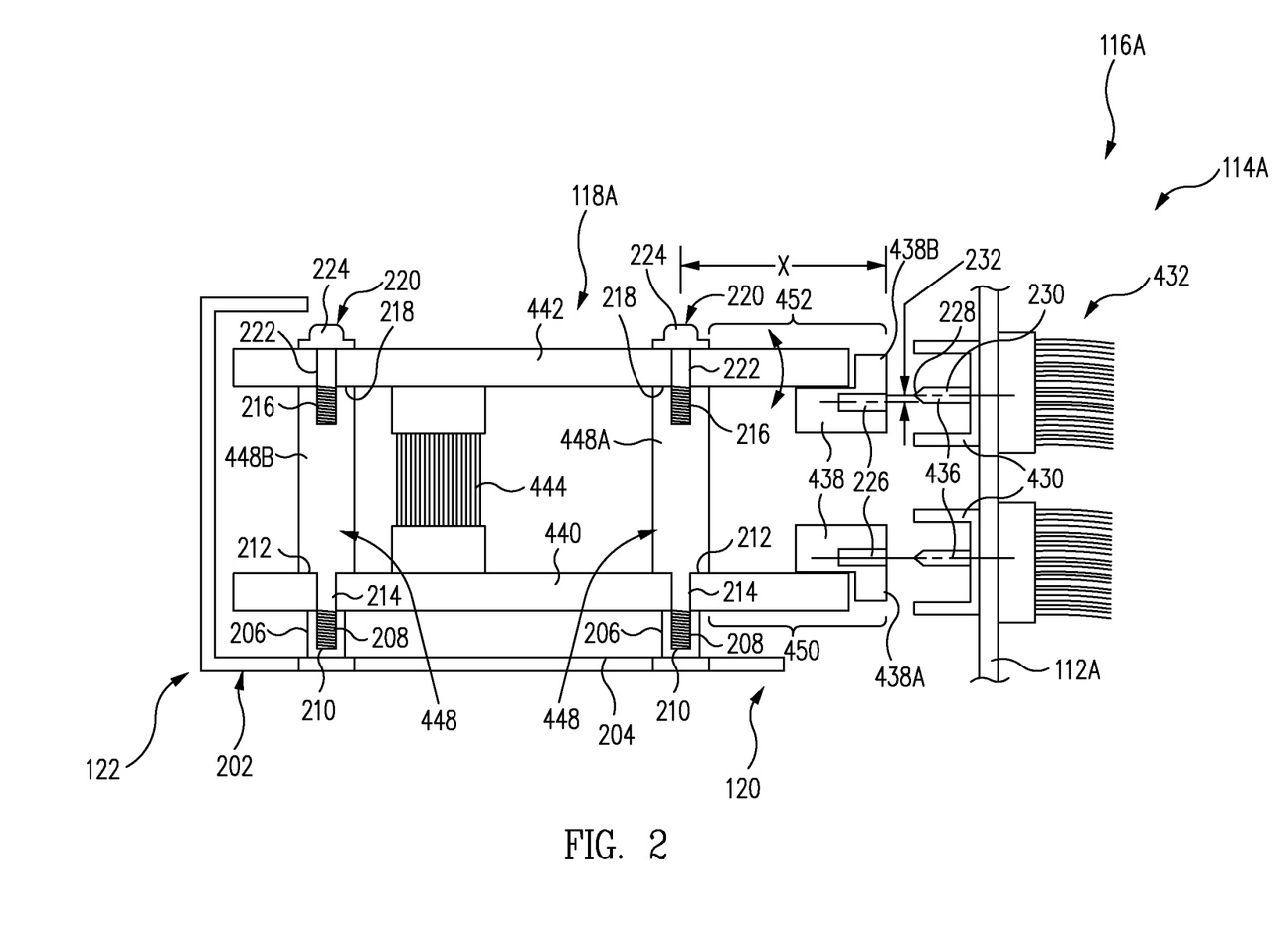
FIG. 2 is a cross-sectional view of a blade and a bulkhead assembly in accordance with one embodiment.

FIG. 2 is a cross-sectional view of a blade 118A and a bulkhead assembly 116A in accordance with one embodiment. Blade 118A includes a bulkhead assembly connector end 120 that mechanically and electrically interconnects with bulkhead assembly 116A.

Bulkhead assembly 116A includes a bulkhead 112A and connectors 430 of a cable cassette 114A. Bulkhead 112A, cable cassette 114A, and bulkhead assembly 116A are similar to bulkhead 112, cable cassette 114, and bulkhead assembly 116 as described above in reference to FIG. 1.

Cable cassette 114A includes a front template, connectors 430, cabling 432, guidepins 436, and a protective cover. The front template and protective cover are not illustrated for purposes of simplicity.

Cabling 432 of cable cassette 114A, e.g., twin axial cabling, provides intra-cassette connections between connectors 430 of cable cassette 114A. Cabling 432 of cable cassette 114A allows connectors 430 to be located at a distance from one another while allowing high speed data to be propagated without the losses typical of traditional printed circuit interconnection systems. Connectors 430 include signal pins (not illustrated) to which blade 118A is electrically connected.

Although a cable cassette 114A is described herein, in other embodiments, connectors 430 are directly mounted to bulkhead 112A without being a part of an integral cable cassette 114A. In yet further embodiments, instead of a bulkhead assembly 116A, a printed circuit board (PCB) backplane includes fixed connectors, e.g., similar to connectors 430. The connectors are fixed in position to the PCB backplane. Thus, although a bulkhead assembly is discussed and illustrated herein, in other embodiments, the discussion is equally applicable to the fixed connectors of a PCB backplane.

Generally, embodiments herein account for the positional error in a blade connector plugging into a mating connector such as connectors 430. The connector can be on a PCB, a cable, optical, or any other connector. The actual signal connection method can be any one of a number of different types.

Referring to the embodiment of FIG. 2 again, connectors 430 are fixed to bulkhead 112A such that the position of connectors 430 is fixed. Accordingly, blade 118A is configured to accommodate both the tolerance in the positions of connectors 430 as well as respective terminals 438 of blade 118A.

In accordance with this embodiment, blade 118A, e.g., a line card, includes a motherboard 440 and a daughter card 442. Motherboard 440, sometimes called a first or primary board, includes a motherboard printed circuit board and various electrical components coupled thereto (not shown) in one embodiment. Similarly, daughter card 442, sometimes called a second board, includes a daughter card PCB and various electrical components coupled thereto (not shown) in accordance with one embodiment. The printed circuit boards each include a dielectric core and electrically conductive traces supported by the dielectric core.

Although blade 118A is illustrated and discussed herein as including a motherboard 440 and a daughter card 442, in other embodiments, generally, a blade has two or more (many) printed circuit boards (PCBs). Any of the PCBs can be regarded as the fixed one and not just the lower PCB. The connector(s) can be on either side of the PCB.

Daughter card 442 is mounted to motherboard 440 by mechanical standoffs 448. Illustratively, daughter card 442 and motherboard 440 are mounted to standoffs 448 using screws, mechanical fasteners or other mounting techniques as discussed further below.

Standoffs 448 are rigid structure thus fixing the distance between daughter card 442 and motherboard 440. Daughter card 442 is also electrically coupled to motherboard 440, e.g., by a cable interface 444, a traditional mezzanine, cable, or other suitable connector, to form blade 118A.

In one embodiment, blade 118A includes both a motherboard and daughter card to allow the combined functionality to be incorporated into a single blade for size reduction. This is in contrast to providing the motherboard and daughter card as separate components, e.g., blades, mounted to bulkhead assembly 116A.

In accordance with this embodiment, blade 118A includes a blade chassis 202. Blade chassis 202 is a rigid support structure for blade 118A. Blade chassis 202 is optional, and in one embodiment, blade 118A does not include blade chassis 202.

Blade chassis 202 includes a blade chassis base 204 parallel to motherboard 440 and daughter card 442. Blade chassis base 204 includes threaded spacers 206 protruding from blade chassis base 204. Threaded spacers 206 include threaded apertures 208.

Standoffs 448 include threaded screw portions 210 protruding from motherboard shoulders 212 of standoffs 448, sometimes called first shoulders 212. Threaded screw portions 210 and more generally standoffs 448 are passed through standoffs openings 214 in motherboard 440 and threaded into threaded apertures 208 of threaded spacers 206. Standoffs 448 are threaded into threaded spacers 206 to compress motherboard 440 between threaded spacers 206 and motherboard shoulders 212. In this manner, motherboard 440 is mounted to blade chassis 202.

Standoffs 448 further include threaded apertures 216 extending into standoffs 448 from daughter card shoulders 218 of standoffs 448, sometimes called second shoulders 218. Threaded screws 220 are passed through standoffs openings 222 in daughter card 442 and threaded into threaded apertures 216 of standoffs 448. Threaded screws 220 are threaded into standoffs 448 to compress daughter card 442 between standoffs 448, i.e., daughter card shoulders 218, and screw heads 224 of threaded screws 220. In this manner, daughter card 442 is mounted to motherboard 440.

Although one particular assembly of blade chassis 202, motherboard 440, daughter card 442, standoffs 448, and threaded screws 220 is set forth, in other embodiments, motherboard 440 is mounted to daughter card 442 by standoffs 448 in a different manner.

At bulkhead assembly connector end 120 of blade 118A, motherboard 440 includes terminal 438A and daughter card 442 includes terminal 438B. Terminals 438A, 438B are collectively referred to as terminals 438.

Standoffs 448 include one or more cantilever standoffs 448A and one or more wiring end standoffs 448B. Cantilever standoffs 448A are those standoffs 448 nearest terminals 438 whereas wiring end standoffs 448B are those standoffs 448 near the opposite wiring end 122 of blade 118A.

In accordance with one embodiment, cantilever standoffs 448A are spaced apart by a distance X from the ends of terminals 438 as illustrated. Cantilever portions 450, 452 of motherboard 440 and daughter card 442 are defined as those portions of motherboard 440 and daughter card 442, respectively, between cantilever standoffs 448A and the ends of terminals 438.

Distance X is sufficiently great such that cantilever portions 450, 452 of motherboard 440 and daughter card 442 can deflect to match any offset between terminals 438A, 438B and connectors 430 of bulkhead assembly 116A without damage to blade 118A including motherboard 440 and daughter card 442. Stated another way, moving cantilever standoffs 448A away from terminals 438A, 438B allows for motherboard 440 and/or daughter card 442 to deflect in a cantilever effect eliminating the binding condition at terminals 438A, 438B.

To illustrate, the allowable deflection of motherboard 440 and/or daughter card 442 is 0.010" deflection, e.g., vertical in the view of FIG. 2, per 1.00" of coplanar distance, e.g., horizontal in FIG. 2, in one embodiment. The allowable amount of deflection depends upon the particular application in other embodiments. For example, the allowable deflection depends upon the board thickness and the component placement on the boards. As one particular example, high density ball grid array (BGA) based PCBs will be more sensitive to bending than sparsely populated through hole PCBs. In one example, the amount of micro strains in the PCBs provides the pass/fail criteria for the allowable amount of deflection.

Terminals 438 include guide pin mating apertures 226 into which guide pins 436 of connectors 430 are configured to fit. Guide pins 436 include tapered tips 228, sometimes called pointy tips 228, at the end of a main body portion 230 of guide pins 436.

As blade 118A is moved towards connectors 430, tapered tips 228 are inserted into guide pin mating apertures 226. If there is an offset between terminals 438 and connectors 430, cantilever portions 450, 452 will bend as guide pins 436 are inserted into guide pin mating apertures 226. More particularly, terminals 438 slide along tapered tips 228 until guide pins 436 are aligned with guide pin mating apertures 226 and inserted therein. As terminals 438 slide along tapered tips 228, cantilever portions 450, 452 bend to accommodate the displacement.

For example, in FIG. 2, guide pin mating aperture 226 of motherboard terminal 438A is in line, i.e., aligned, with the respective guide pin 436. However, an offset 232 exists between guide pin mating aperture 226 of daughter card terminal 438B and the respective guide pin 436. Cantilever portions 450, 452 bend, sometimes called deflect, to accommodate offset 232 and allow easy coupling of terminals 438 to respective connectors 430.

Figure 3:
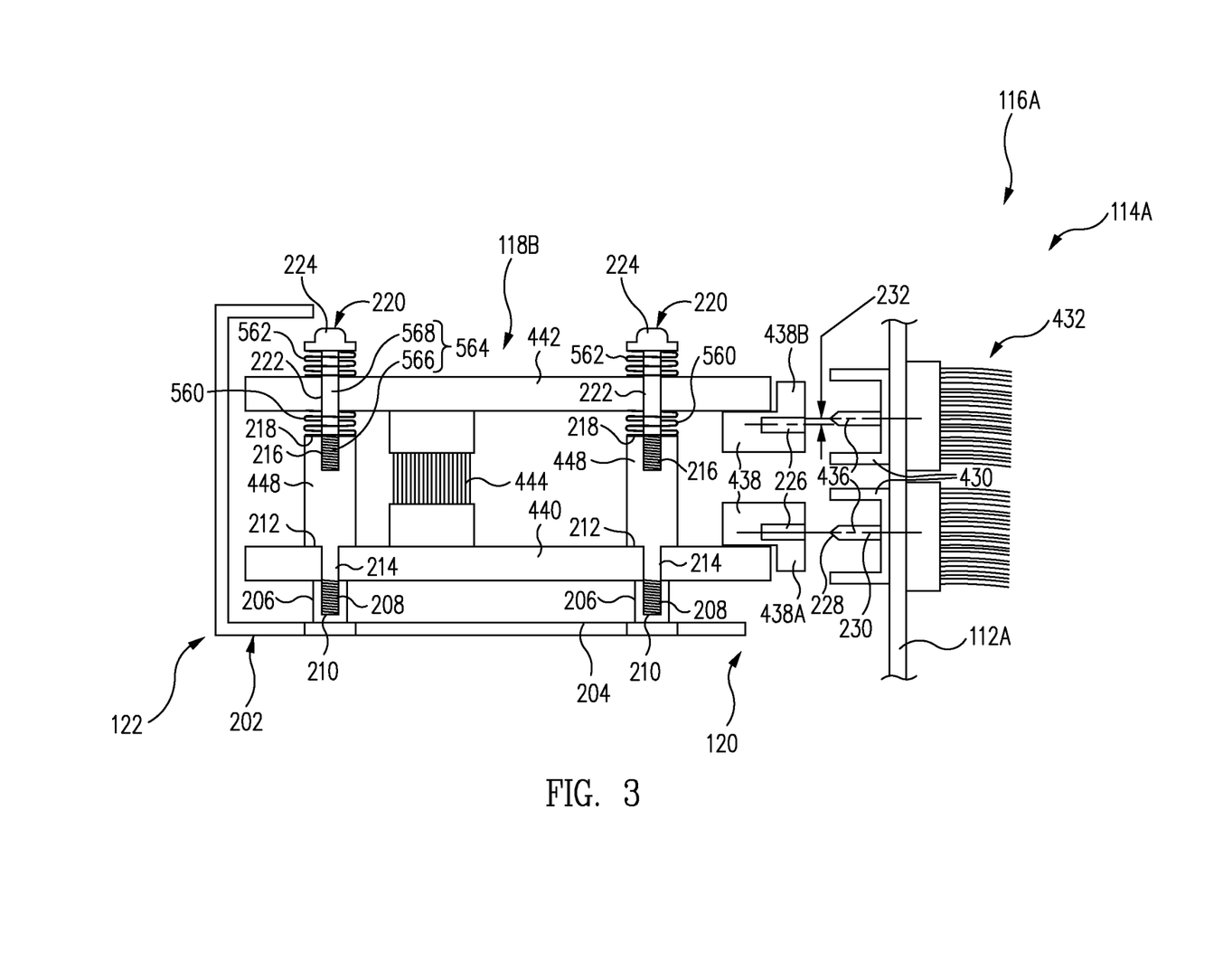
FIG. 3 is a cross-sectional view of a blade and a bulkhead assembly in accordance with another embodiment.

FIG. 3 is a cross-sectional view of a blade 118B and bulkhead assembly 116A in accordance with another embodiment. Blade 118B is similar to blade 118A of FIG. 2 and only the significant differences between blades 118A and 118B are discussed below.

In accordance with the embodiment as illustrated in FIG. 3, springs 560, e.g., helical springs, spring washers, or other elastic members, are placed between standoffs 448 and daughter card 442. More particularly, springs 560 are placed between daughter card shoulders 218 of standoffs 448 and daughter card 442 and around threaded screws 220. Standoffs 448 are mounted to motherboard 440. Springs 560 are resilient members thus allowing daughter card 442 to move relative to standoffs 448 and thus relative to motherboard 440.

Further, springs 562, e.g., similar to springs 560 including helical springs, spring washers, or other elastic members, are placed between screw heads 224 of threaded screws 220 and daughter card 442 and around threaded screws 220.

In one embodiment, threaded screws 220 included partially threaded screw portions 564. Partially threaded screw portions 564 included threaded portions 566 and solid portions 568. Threaded portions 566 have threads. In contrast, solid portions 568 having a solid outer surface, e.g., a cylindrical surface having an absence of threads.

Threaded portions 566 are threaded into threaded apertures 216 of standoffs 448 until solid portions 568 reach threaded apertures 216 and daughter card shoulders 218. As solid portions 568 lack mating threads of threaded apertures 216, solid portions 568 prevent further threading of threaded screws 220 into threaded apertures 216. Accordingly, solid portions 568 precisely set the height of screw heads 224 above daughter cards shoulders 218 of standoffs 448 to give a precise amount of float for daughter card 442. Further, solid portions 568 prevent threaded screws 220 from being over tightened and inhibiting float of daughter card 442.

Springs 560, 562 allow daughter card 442 and/or motherboard 440 to move to match any offset between terminals 438A, 438B and connectors 430 of bulkhead assembly 116A without damage to blade 118B. More particularly, springs 560, 562 allow daughter card 442 and/or motherboard 440 to float both up and down, i.e., vertically, from a nominal position.

Stated another way, floating daughter card 442 eliminates the binding condition by allowing the entire daughter card 442 and/or motherboard 440 to float. Springs 560, 562 and standoffs 448 effectively provide a compliant standoff between daughter card 442 and motherboard 440 allowing daughter card 442 and/or motherboard 440 the freedom to float.

Although both springs 560, 562 are illustrated and discussed above, in another embodiment, only springs 560 or springs 562 are used. For example, only springs 560 are used such that screw heads 224 directly contact daughter card 442 allowing daughter card 442 the freedom to move closer to motherboard 440 only. As another example, only springs 562 are used such that daughter card shoulders 218 directly contact daughter card 442 allowing daughter card 442 the freedom to move away from motherboard 440 only.

Further, cable interface 444, sometimes called a cable connection between daughter card 442 and motherboard 440, further allows daughter card 442 and/or motherboard 440 the freedom to float. However, in other embodiments, cable interface 444 is not provided, e.g., there are no direct connections or no connections at all between daughter card 442 and motherboard 440. In another embodiment, the electrical elements can be on one or both sides of the standoffs. In yet another embodiment, the electrical elements can be adjacent either daughter card 442 and/or motherboard 440.

In another embodiment, a blade includes different types of standoff connections between daughter card 442 and motherboard 440. For example, a blade includes one or more wiring end standoffs 448B at wiring end 122 as illustrated in FIG. 2. Wiring end standoffs 448B hold daughter card 442 and motherboard 440 fixed and parallel to each other at wiring end 122 with no float. As the position of daughter card 442 and motherboard 440 is fixed at wiring end 122, a fixed connector between daughter card 442 and motherboard 440 can be used in contrast to a compliant connector that accommodates tolerance in the positions. However, in one embodiment, a compliant connector is used to interconnect daughter card 442 to motherboard 440.

Further, the blade includes one or more standoffs 448 including springs 560 and/or springs 562 at bulkhead assembly connector ends 120 as illustrated in FIG. 3. Springs 560, 562 allow daughter card 442 to float relative to motherboard 440 at bulkhead assembly connector end 120 as discussed above.

Figure 4:
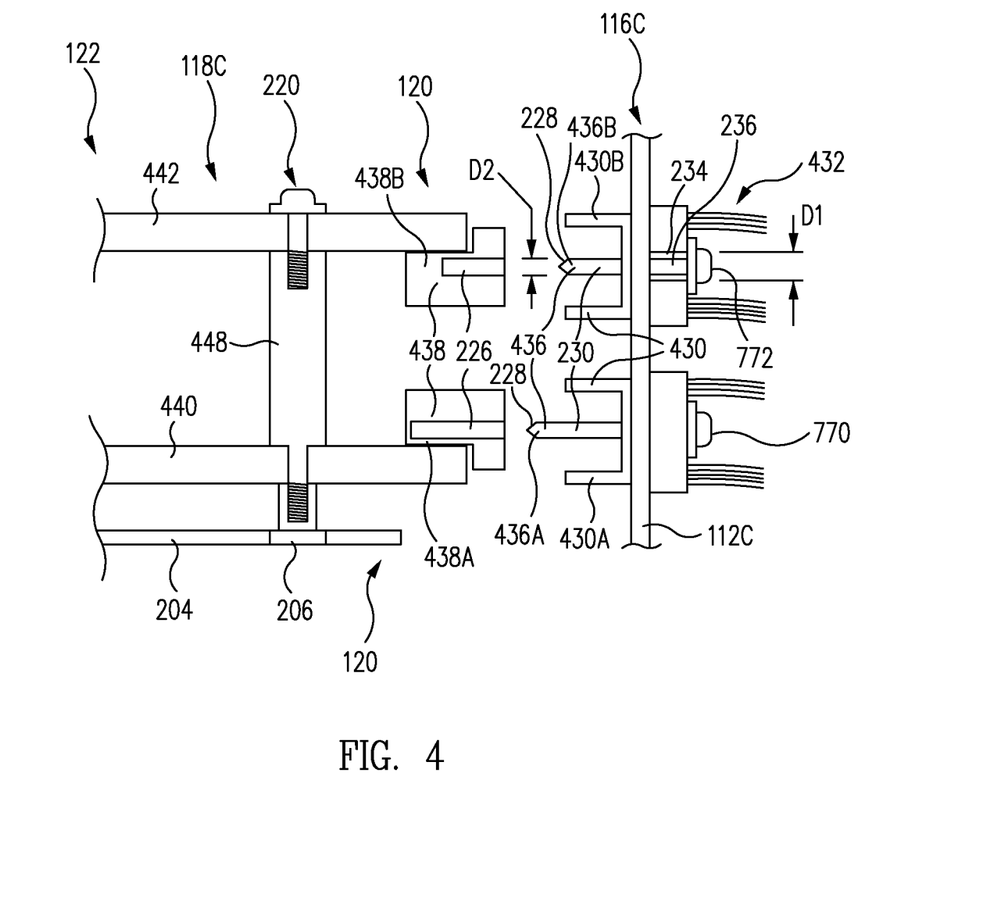
FIG. 4 is a cross-sectional view of a blade and a bulkhead assembly in accordance with yet another embodiment.

FIG. 4 is a cross-sectional view of a blade 118C, e.g., a line card, and a bulkhead assembly 116C in accordance with yet another embodiment. Blade 118C of FIG. 4 is similar to blade 118A of FIG. 2 except that daughter card 442 is fixed in position to motherboard 440 such that terminals 438A, 438B are fixed in position relative to one another. As the position of daughter card 442 and motherboard 440 is fixed, a fixed connector between daughter card 442 and motherboard 440 can be used in contrast to, a compliant connector that accommodates tolerance in the positions. However, in one embodiment, a compliant connector is used to interconnect daughter card 442 to motherboard 440.

In accordance with this embodiment, connectors 430 include a fixed connector 430A and a floating connector 430B. Fixed connector 430A is fixed in position, e.g., with a screw 770, to a bulkhead 112C. In contrast, floating connector 430B floats, i.e., moves within a defined range, relative to bulkhead 112C. For example, floating connector 430B is connected to bulkhead 112C by a shouldered screw 772.

More particularly, floating connector 430B has an opening 234 with a diameter D1 larger than a diameter D2 of a shaft 236 of shouldered screw 772. Shaft 236 of shouldered screw 772 is located within opening 234 of floating connector 430B. As opening 234 has a larger diameter D1 than diameter D2 of shaft 236, floating connector 430B can move relative to shouldered screw 772 and bulkhead 112C.

Accordingly, floating connector 430B can float to accommodate any tolerance in the position of terminals 438 of daughter card 442 and/or motherboard 440. Floating connector 430B can float up and down, i.e., vertically, and/or left and right, i.e., horizontally. The amount of float is defined by the dimensions of shaft 236 and opening 234. In one embodiment, the float is asymmetric, e.g., in one direction. Further, cables 432 connected to floating connector 430B are flexible thus allowing floating connector 430B to move.

Further, in the embodiment shown, guidepins 436 include a fixed connector guidepin 436A of fixed connector 430A and a floating connector guidepin 436B of floating connector 430B. Fixed connector guidepin 436A is longer than floating connector guidepin 436B.

Thus, during coupling of blade 118C to bulkhead assembly 116C, fixed connector guidepin 436A engages motherboard 440 before floating connector guidepin 436B engages daughter card 442. Thus motherboard 440 and daughter card 442 are fixed in position relative to fixed connector 430A first. Then floating connector 430B floats to accommodate the position of daughter card 442, e.g., in the vertical and/or horizontal directions.

Figure 5:
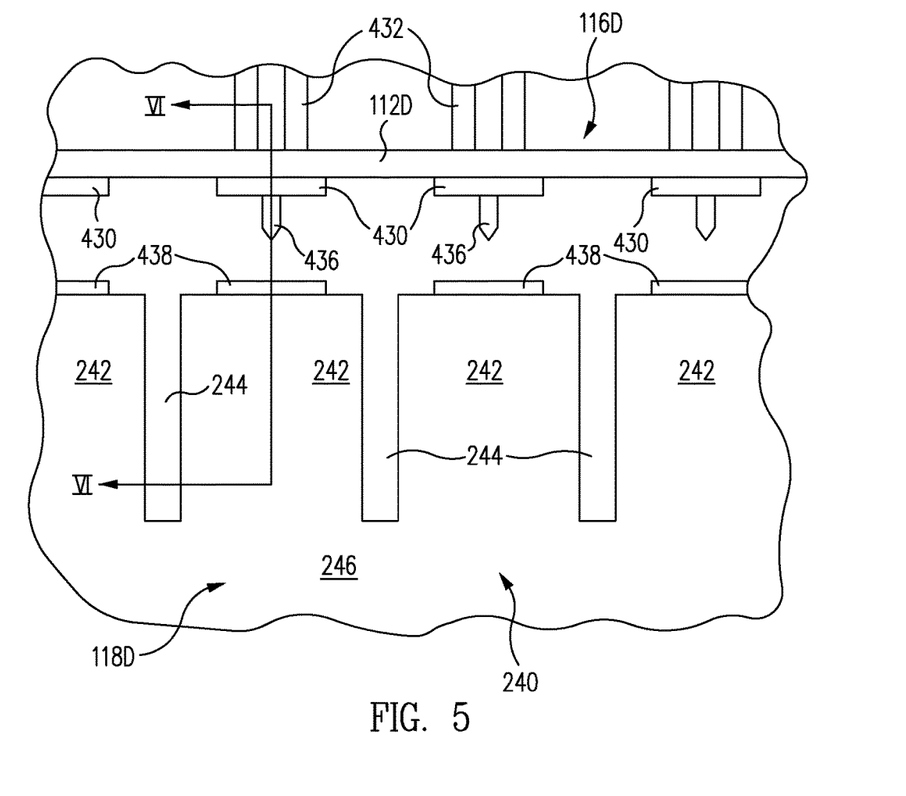
FIG. 5 is a top plan view of a blade and a bulkhead assembly in accordance with another embodiment.
Figure 6:
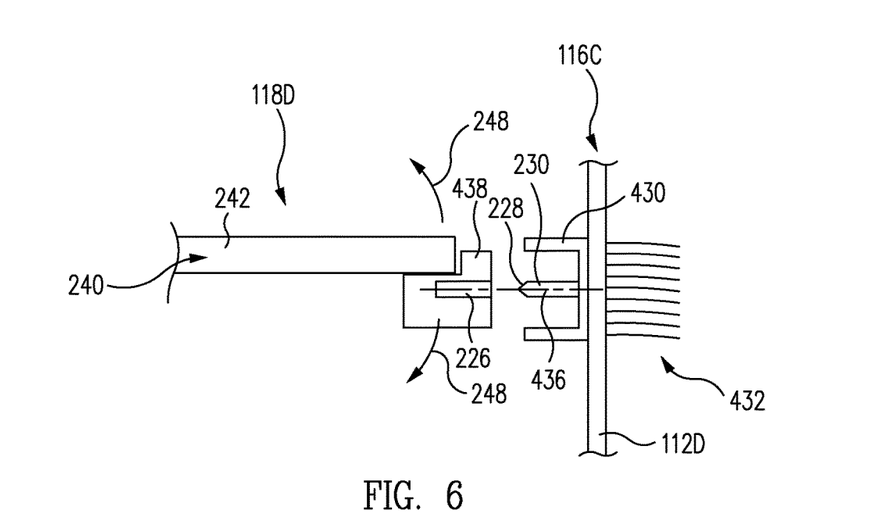
FIG. 6 is a cross-sectional view of the blade and the bulkhead assembly along the line VI-VI of FIG. 5 in accordance with one embodiment.

FIG. 5 is a top plan view of a blade 118D and a bulkhead assembly 116D in accordance with another embodiment. FIG. 6 is a cross-sectional view of blade 118D and bulkhead assembly 116D along the line VI-VI of FIG. 5 in accordance with one embodiment.

Referring now to FIGS. 5 and 6 together, blade 118D includes at least one board 240. For example, board 240 includes a printed circuit board and various electrical components coupled thereto (not shown). Board 240 is any type of board, e.g., is similar to motherboard 440 or daughter card 442 as discussed above, or other boards depending upon the particular application.

However, in accordance with this embodiment, board 240 includes a plurality of terminals 438 substantially within a plane of board 240. Further, bulkhead assembly 116D includes a plurality of respective connectors 430 for mating with terminals 438 of board 240. Connectors 430 are fixed in position on a bulkhead 112D.

To accommodate tolerance, sometimes called offset, between terminals 438 and connectors 430, board 240 is formed with a plurality of flexible fingers 242. Terminals 438 are coupled to fingers 242.

In accordance with this embodiment, a slot 244 is formed between respective fingers 242. Fingers 242 protrude from a main board portion 246 of board 240. In one embodiment, the printed circuit board of board 240 is cut between terminals 438 to form slots 244 and define fingers 242.

Fingers 242 are flexible and can bend from main body portion 246 to accommodate offset between terminals 438 and respective connectors 430 as indicated by the arrows 248 in FIG. 6.

Although blade 118D is illustrated as only including a single board 240, in other embodiments, blade 118D includes a plurality of boards, e.g., includes a motherboard 440 coupled to a daughter card 442 as discussed in any of the embodiments above. One, some, or all of the boards can include a plurality of terminals 438 including respective flexible fingers 242 as described above in regards to board 240.

The drawings and the forgoing description gave examples of embodiments. The scope of the embodiments, however, is by no means limited by these specific examples. Numerous variations, whether explicitly given in the specification or not, such as differences in structure, dimension, and use of material, are possible.

What is claimed is:

1. An electronic device comprising:
   a first circuit board comprising electrical components;
   a second circuit board comprising electrical components;
   a standoff coupled to the first circuit board, the standoff comprising a threaded aperture;
   a threaded screw passing through the second circuit board and into the threaded aperture;
   a spring around the threaded screw; and
   a cable interface electrically connecting the first circuit board and the second circuit board, the cable interface allowing the second circuit board the freedom to float relative to the first circuit board while maintaining the electrical connection between the first circuit board and the second circuit board.

2. The electronic device of claim 1 wherein the spring allows the second circuit board to float relative to the first circuit board.

3. The electronic device of claim 1 wherein the standoff comprises a shoulder, the spring being located between the shoulder and the second circuit board.

4. The electronic device of claim 1 wherein the threaded screw comprises a screw head, the spring being located between the screw head and the second circuit board.

5. The electronic device of claim 1 wherein the spring allows terminals of the first circuit board and the second circuit board to move relative to mating connectors.

6. The electronic device of claim 1 wherein the spring accommodates tolerance in the positioning of terminals of the first circuit board and the second circuit board with respect to mating connectors.

7. The electronic device of claim 6 wherein the first circuit board comprises:
   a plurality of flexible fingers; and
   a plurality of the terminals within a plane of the first circuit board and coupled to the fingers.

8. An electronic device comprising
a first circuit board comprising electrical components;
a second circuit board comprising electrical components;
a standoff coupled to the first circuit board, the standoff comprising a threaded aperture;
a threaded screw comprising a partially threaded screw portion comprising a solid portion and a threaded portion, the solid portion passing through the second circuit board, the threaded portion being threaded into the threaded aperture;
a spring around the solid portion; and
a cable interface electrically connecting the first circuit board and the second circuit board the cable interface allowing the second circuit board the freedom to float relative to the first circuit board while maintaining the electrical connection between the first circuit board and the second circuit board.

9. The electronic device of claim 8 wherein the solid portion comprises a cylindrical surface having an absence of threads.

10. The electronic device of claim 8 wherein the threaded portion is threaded into the threaded aperture until the solid portion reaches the threaded aperture.

11. The electronic device of claim 8 wherein the standoff further comprise a shoulder, the threaded aperture extending into the standoff from the shoulder.

12. The electronic device of claim 11 wherein the threaded portion extends into the standoff from the shoulder.

13. The electronic device of claim 11 wherein the solid portion sets a height of a screw head of the threaded screw above the shoulder.

14. The electronic device of claim 12 wherein the solid portion extends outward from the shoulder.

15. An electronic device comprising:
a blade chassis base comprising a threaded spacer;
a first circuit board comprising electrical components;
a second circuit board comprising electrical components;
a standoff comprising a threaded aperture and a first shoulder, the first circuit board being compressed between the first shoulder and the threaded spacer;
a threaded screw passing through the second circuit board and into the threaded aperture;
a first spring around the threaded screw; and
a cable interface electrically connecting the first circuit board and the second circuit board, the cable interface allowing the second circuit board the freedom to float relative to the first circuit board while maintaining, the electrical connection between the first circuit board and the second circuit board.

16. The electronic device of claim 15 wherein the standoff further comprises a threaded screw portion protruding from the first shoulder.

17. The electronic device of claim 15 wherein the standoff further comprises a second shoulder and the threaded screw comprises a screw head, the first spring being, located between the second shoulder and the second circuit board, the electronic device further comprising a second spring between the screw head and the second circuit board.

18. The electronic device of claim 16 wherein the threaded screw portion is threaded into the threaded spacer.

19. The electronic device of claim 16 wherein the threaded screw portion passes through a standoff opening in the first circuit board.

* * * * *